(12) United States Patent
Hashimoto et al.

(10) Patent No.: US 11,048,160 B2
(45) Date of Patent: Jun. 29, 2021

(54) MASK BLANK, PHASE SHIFT MASK AND METHOD FOR MANUFACTURING SEMICONDUCTOR DEVICE

(71) Applicant: HOYA CORPORATION, Tokyo (JP)

(72) Inventors: Masahiro Hashimoto, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 58 days.

(21) Appl. No.: 16/622,802

(22) PCT Filed: May 16, 2018

(86) PCT No.: PCT/JP2018/018872
§ 371 (c)(1),
(2) Date: Dec. 13, 2019

(87) PCT Pub. No.: WO2018/230233
PCT Pub. Date: Dec. 20, 2018

(65) Prior Publication Data
US 2021/0149293 A1    May 20, 2021

(30) Foreign Application Priority Data
Jun. 14, 2017  (JP) .............................. JP2017-116510

(51) Int. Cl.
*G03F 1/32* (2012.01)
*H01L 21/033* (2006.01)

(52) U.S. Cl.
CPC ............ *G03F 1/32* (2013.01); *H01L 21/0332* (2013.01); *H01L 21/0337* (2013.01)

(58) Field of Classification Search
None
See application file for complete search history.

(56) References Cited

U.S. PATENT DOCUMENTS

| 2005/0019674 A1 | 1/2005 | Okubo et al. |
| 2006/0088774 A1 | 4/2006 | Yoshikawa et al. |

(Continued)

FOREIGN PATENT DOCUMENTS

| JP | H07-128840 | 5/1995 |
| JP | 2006-146151 | 6/2006 |

(Continued)

OTHER PUBLICATIONS

PCT/JP2018/018872, English translation of International Search Report dated Aug. 7, 2018.

*Primary Examiner* — Roberts P Culbert
(74) *Attorney, Agent, or Firm* — Kilpatrick Townsend & Stockton LLP (57) ABSTRACT

This mask blank has a structure wherein a phase shift film and a light shielding film are sequentially formed as layers in this order on a transparent substrate. The optical density of the layered structure composed of the phase shift film and the light shielding film with respect to exposure light, which is an ArF excimer laser, is 3.5 or more; and the light shielding film has a structure wherein a lower layer and an upper layer are formed as layers sequentially from the transparent substrate side. The lower layer is formed from a material wherein the total content of chromium, oxygen, nitrogen and carbon is 90 atomic % or more; and the upper layer is formed from a material wherein the total content of metals and silicon is 80 atomic % or more. The extinction coefficient $k_U$ of the upper layer for the exposure light is higher than the extinction coefficient $k_L$ of the lower layer for the exposure light.

17 Claims, 3 Drawing Sheets

(56) References Cited

U.S. PATENT DOCUMENTS

| | | |
|---|---|---|
| 2007/0212618 A1 | 9/2007 | Yoshikawa et al. |
| 2015/0160549 A1 | 6/2015 | Sasamoto et al. |
| 2015/0268552 A1 | 9/2015 | Nam et al. |
| 2016/0187769 A1 | 6/2016 | Nozawa et al. |
| 2017/0139316 A1* | 5/2017 | Shishido .................. G03F 1/58 |

FOREIGN PATENT DOCUMENTS

| | | |
|---|---|---|
| JP | 2007-241065 | 9/2007 |
| JP | 2007-241137 | 9/2007 |
| JP | 2009-265508 | 11/2009 |
| JP | 2015-111212 | 6/2015 |
| JP | 2015-184672 | 10/2015 |
| JP | 2016-191877 | 11/2016 |
| JP | 2017-033016 | 2/2017 |
| WO | 2004-090635 | 10/2004 |

* cited by examiner

MASK BLANK, PHASE SHIFT MASK AND METHOD FOR MANUFACTURING SEMICONDUCTOR DEVICE

CROSS REFERENCE TO RELATED APPLICATIONS

This application is a National Stage of International Application No. PCT/JP2018/018872 filed May 16, 2018, which claims priority to Japanese Patent Application No. 2017-116510 filed Jun. 14, 2017, and the contents of which is incorporated by reference in its entirety.

TECHNICAL FIELD

This disclosure relates to a mask blank for a phase shift mask, a phase shift mask, and a method for manufacturing a semiconductor device using the phase shift mask.

BACKGROUND ART

In general, in a manufacturing process for a semiconductor device, a fine pattern is formed using a photolithography method. In forming the fine pattern, a number of substrates, which are called transfer masks, are generally used. Each of the transfer masks is generally obtained by forming a fine pattern formed of a metal thin film or the like on a transparent glass substrate. The photolithography method is used also in manufacture of the transfer mask.

As a type of the transfer mask, a halftone-type phase shift mask is known in addition to an existing binary mask having a light shielding film pattern of a chromium-based material formed on a transparent substrate. The halftone-type phase shift mask comprises a transparent substrate with a pattern of a phase shift film formed thereon. The phase shift film has a function of transmitting light at an intensity which does not substantially contribute to exposure and causing the light having been transmitted through the phase shift film to have a predetermined phase difference with respect to light having passed through air by the same distance. In this manner, a so-called phase shift effect is produced.

As disclosed in Patent Document 1, in case where a pattern of a transfer mask is transferred by exposure onto a resist film on a single semiconductor wafer by using an exposure apparatus, the pattern of the transfer mask is repeatedly transferred by exposure to different positions of the resist film. Furthermore, such repetition of transfer by exposure onto the resist film is carried out without spaces. The exposure apparatus is provided with an aperture so that exposure light is emitted only to a region (transfer region) of the transfer mask where the transfer pattern is formed. However, there is a limit in accuracy of covering (shielding) the exposure light by the aperture and the exposure light inevitably leaks to the outside of the transfer region of the transfer mask. Accordingly, in an outer peripheral region around the region of the transfer mask where the transfer pattern is formed, it is required to assure an optical density (OD: Optical Density) of a predetermined value or more so that, during transfer by exposure to the resist film on the semiconductor wafer by using the exposure apparatus, the resist film is not affected by the exposure light having been transmitted through the outer peripheral region. Generally, in the outer peripheral region of the transfer mask, OD is desirably equal to 3 or more (transmittance of about 0.1% or less) and is required to be at least about 2.8 (transmittance of about 0.16%).

However, the phase shift film of the halftone-type phase shift mask has a function of transmitting the exposure light at a predetermined transmittance. With the phase shift mask alone, it is difficult to ensure the optical density required for the outer peripheral region of the transfer mask. Therefore, as disclosed in Patent Document 1, in case of the halftone-type phase shift mask, a light shielding layer (light shielding zone) is formed as a layer on a light semi-transparent layer in the outer peripheral region so as to ensure the above-mentioned optical density of a predetermined value or more with a layered structure of the light semi-transparent layer and the light shielding layer.

On the other hand, as disclosed in Patent Document 2, there is already known, as a mask blank for a halftone-type phase shift mask, a mask blank having a structure in which a halftone phase shift film of a metal silicide-based material, a light shielding film of a chromium-based material, and an etching mask film of an inorganic material are formed as layers on a transparent substrate. In case where a phase shift mask is manufactured by using the mask blank, at first, the etching mask film is patterned by dry etching with a fluorine-based gas using, as a mask, a resist pattern formed on a surface of the mask blank to form an etching mask film pattern. Next, the light shielding film is patterned by dry etching with a mixture of chlorine and oxygen using the etching mask film pattern as a mask to form a light shielding film pattern.

Furthermore, the phase shift film is patterned by dry etching with a fluorine-based gas using the light shielding film pattern as a mask.

PRIOR ART DOCUMENT(S)

Patent Document(S)

Patent Document 1: JP H7-128840 A
Patent Document 2: WO 2004/090635 A1

SUMMARY OF THE DISCLOSURE

Problem to be Solved by the Disclosure

In recent years, in exposure technology using an ArF excimer laser (having a wavelength of 193 nm) as exposure light, miniaturization of a transfer pattern is advancing and it is required to adapt to a pattern line width smaller than the wavelength of the exposure light. In addition to ultrahigh NA technology (immersion exposure or the like) with NA (Numerical Aperture) of 1 or more, SMO (Source Mask Optimization) is beginning to be used which is a source-and-mask optimization technology of optimizing illumination of the exposure apparatus for all patterns on a mask. The exposure apparatus to which the SMO is applied has a complicated illumination system. When the phase shift mask is placed in the exposure apparatus and irradiated with the exposure light, the exposure light is sometimes incident to the light shielding film (light shielding zone) of the phase shift mask in multiple directions.

In an existing light shielding film, light shielding performance (optical density) is determined on the assumption that the exposure light having been transmitted through the phase shift film at a predetermined transmittance is incident from a surface of the light shielding film on the same side as the phase shift film and is emitted from the other surface on the opposite side to the phase shift film. However, it has been found out that, if the phase shift mask is irradiated with the exposure light of the complicated illumination system mentioned above, the exposure light having been transmitted through the phase shift film and incident from the surface of the light shielding film on the side as the phase shift film is more likely emitted from a pattern side wall of the light shielding zone than in the past. The exposure light (leaking light) emitted from the pattern side wall is not sufficiently attenuated in light intensity and, therefore, causes the resist film formed on the semiconductor wafer or the like to be exposed, although slightly. If a region of the resist film where the transfer pattern is to be positioned is exposed even slightly, a CD (Critical Dimension) of a resist pattern formed by developing the transfer pattern transferred by exposure to that region is seriously decreased.

Figure 3:
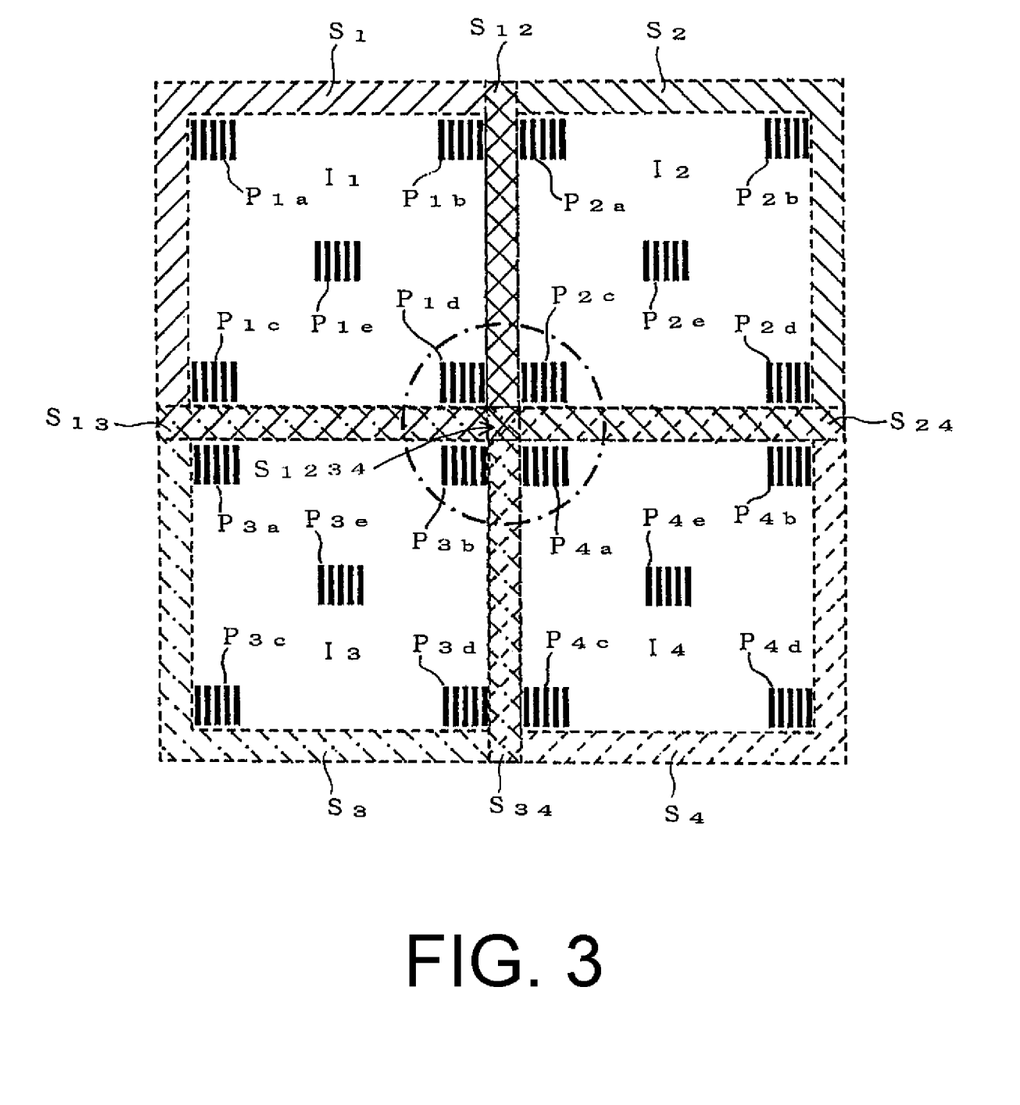
FIG. 3 is a schematic view for illustrating an arrangement of respective transfer patterns when a transfer pattern of a phase shift mask is repeatedly transferred by exposure to a resist film.

FIG. 3 is a view for describing a case where the transfer pattern of the phase shift mask is repeatedly transferred four times to the resist film on the semiconductor wafer. An image $I_1$ is an image transferred when the transfer pattern of the phase shift mask is transferred by exposure at one time. The same applies to images $I_2$, $I_3$, and $I_4$. Images $P_{1a}$ to $P_{1e}$ are patterns transferred by the same transfer by exposure. The same applies to images $P_{2a}$ to $P_{2e}$, to images $P_{3a}$ to $P_{3e}$, and to images $P_{4a}$ to $P_{4e}$. Images $S_1$, $S_2$, $S_3$, and $S_4$ are images obtained by transferring a light shielding zone pattern of the phase shift mask. As shown in FIG. 3, repetition of transfer by exposure of the transfer pattern of the phase shift mask to the resist film by the exposure apparatus is carried out without spaces. Therefore, light shielding zone patterns of adjacent transferred images are transferred in an overlapped state. In FIG. 3, $S_{12}$, $S_{13}$, $S_{24}$, and $S_{34}$ are regions where two transferred images of the light shielding zone are transferred in an overlapped state. $S_{1234}$ is a region where four transferred images of the light shielding zone are transferred in an overlapped state.

In recent years, partly because miniaturization of a semiconductor device is remarkable, transfer patterns of the phase shift film are increasingly frequently arranged to the vicinity of the light shielding zone (image $S_1$), like the images Pia to pie in FIG. 3. Arrangement of a plurality of transfer patterns repeatedly transferred to the resist film on the semiconductor wafer is in a positional relationship that the adjacent light shielding zone patterns are overlapped with each other. A region where the light shielding zone patterns are transferred by exposure in an overlapped state is used as a cutting margin when respective chips are formed on the semiconductor wafer and thereafter cut and separated.

In such a case, when fine patterns arranged in the vicinity of the light shielding zone are transferred by exposure to the resist film and the resist pattern is formed by developing treatment and so on, a phenomenon of decrease in CD accuracy tends to easily occur due to the leaking light of the exposure light that is generated from the light shielding zone. This becomes a problem. In particular, in the fine patterns (the patterns $p_{1d}$, $p_{2c}$, $p_{3b}$, $p_{4a}$ surrounded by a dash-and-dot circle in FIG. 3) arranged in the vicinity of the region $S_{1234}$ of the resist film that is subjected to transfer by exposure of the light shielding zone pattern four times, a cumulative irradiation amount of the leaking light tends to be large, which particularly becomes a problem.

As a method for solving the above-mentioned problems, it is proposed to increase the optical density (OD) of the light shielding zone by simply increasing a film thickness of the light shielding film. However, if the film thickness of the light shielding film is increased, it is necessary to increase a film thickness of the resist pattern (resist film) to be used as a mask upon carrying out etching for forming the transfer pattern on the light shielding film. Heretofore, the phase shift mask is often formed of a material containing silicon while the light shielding film is formed of a material containing chromium (chromium-based material) having a high etching selectivity with respect to the phase shift film. The light shielding film of the chromium-based material is patterned by dry etching with a mixture of a chlorine-based gas and an oxygen gas. The resist film is low in resistance against the dry etching with the mixture of the chlorine-based gas and the oxygen gas. Therefore, although an increase in film thickness of the light shielding film requires the film thickness of the resist film to be considerably increased, a problem such as collapse or loss of the resist pattern tends to easily occur if a fine pattern is formed on the resist film.

On the other hand, as disclosed in Patent Document 2, it is possible to reduce the film thickness of the resist film by forming, on the light shielding film of the chromium-based material, a hard mask film made of a material containing silicon. However, when the light shielding film of the chromium-based material is patterned by dry etching with the mixture of the chlorine-based gas and the oxygen gas, etching tends to progress in a pattern side wall direction. Therefore, in case where the light shielding film is subjected to dry etching using, as a mask, the hard mask film having a fine pattern, a side etching amount tends to become large if the film thickness of the light shielding film is large. Consequently, the CD accuracy of a fine pattern formed on the light shielding film tends to be decreased. The decrease in CD accuracy of the fine pattern on the light shielding film leads to a decrease in CD accuracy of a fine pattern formed on the phase shift film by dry etching using, as a mask, the fine pattern on the light shielding film. This becomes a problem. Furthermore, the light shielding film after patterned is subjected to a cleaning process. If the film thickness of the light shielding film is large, there is a problem that collapse of the pattern of the light shielding film easily occurs during cleaning.

In order to solve the above-mentioned problem, this disclosure relates to a mask blank having a structure in which a phase shift film formed of a material containing silicon and a light shielding film including a layer formed of a material containing chromium are formed as layers on a transparent substrate in this order, and a first aspect of this disclosure is to provide a mask blank having a higher optical density than before in a layered structure of the phase shift film and the light shielding film so that, even in case where a phase shift mask manufactured from the mask blank is placed in an exposure apparatus of a complicated illumination system to which SMO is applied and transfer by exposure is carried out on a resist film formed on a semiconductor wafer or the like as a transfer object, a fine pattern formed on the resist film after developing treatment has a high CD accuracy.

In addition, it is a second aspect of this disclosure is to provide a mask blank in which a fine pattern formed on a light-shielding film by dry etching has a high CD accuracy and occurrence of collapse of a light shielding film pattern is suppressed.

Furthermore, this disclosure relates to a phase shift mask manufactured using the mask blank mentioned above and another aspect of this disclosure is to provide a phase shift mask in which a light shielding zone having a higher optical density than before can be formed so that, even in case where the phase shift mask is placed in an exposure apparatus of a complicated illumination system and transfer by exposure is carried out on a resist film, a fine pattern formed on the resist film after developing treatment has a high CD accuracy and in which a fine pattern can be formed on a phase shift film with high accuracy.

It is a further aspect of this disclosure to provide a method for manufacturing a semiconductor device using the phase shift mask.

Means to Solve the Problem

In order to achieve the above-mentioned aspects, this disclosure has the following structures.

(Structure 1)

A mask blank having a structure in which a phase shift film and a light shielding film are formed as layers on a transparent substrate in this order, wherein:

a layered structure of the phase shift film and the light shielding film has an optical density of 3.5 or more with respect to exposure light of an ArF excimer laser;

the light shielding film has a structure in which a lower layer and an upper layer are formed as layers from the side of the transparent substrate;

the lower layer is formed of a material containing chromium with a total content of chromium, oxygen, nitrogen, and carbon being 90 atomic % or more;

the upper layer is formed of a material containing metal and silicon with a total content of metal and silicon being 80 atomic % or more; and the upper layer has an extinction coefficient $k_U$ with respect to the exposure light which is greater than an extinction coefficient $k_L$ of the lower layer with respect to the exposure light.

(Structure 2)

The mask blank according to structure 1, wherein the phase shift film has a transmittance of 1% or more with respect to the exposure light.

(Structure 3)

The mask blank according to structure 1 or 2, wherein the extinction coefficient $k_L$ of the lower layer is 2.0 or less while the extinction coefficient $k_U$ of the upper layer is greater than 2.0.

(Structure 4)

The mask blank according to any one of structures 1 to 3, wherein the upper layer has a refractive index $n_U$ with respect to the exposure light which is smaller than a refractive index $n_L$ of the lower layer with respect to the exposure light and a ratio $n_U/n_L$ is 0.8 or more where the ratio is obtained by dividing the refractive index $n_U$ of the upper layer with respect to the exposure light by the refractive index $n_L$ of the lower layer with respect to the exposure light.

(Structure 5)

The mask blank according to structure 4, wherein the refractive index $n_L$ of the lower layer is 2.0 or less while the refractive index $n_U$ of the upper layer is smaller than 2.0.

(Structure 6)

The mask blank according to any one of structures 1 to 5, wherein the lower layer is formed of a material with the total content of chromium, oxygen, and carbon being 90 atomic % or more.

(Structure 7)

The mask blank according to any one of structures 1 to 6, wherein the upper layer is formed of a material with the total content of tantalum and silicon being 80 atomic % or more.

(Structure 8)

The mask blank according to any one of structures 1 to 7, wherein the phase shift film is formed of a material containing silicon.

(Structure 9)

A phase shift mask having a structure in which a phase shift film having a transfer pattern and a light shielding film having a light shielding zone pattern are formed as layers on a transparent substrate in this order;

a layered structure of the phase shift film and the light shielding film has an optical density of 3.5 or more with respect to exposure light of an ArF excimer laser;

the light shielding film has a structure in which a lower layer and an upper layer are formed as layers from the side of the transparent substrate;

the lower layer is formed of a material containing chromium with a total content of chromium, oxygen, nitrogen and carbon being 90 atomic % or more;

the upper layer is formed of a material containing metal and silicon with a total content of metal and silicon being 80 atomic % or more;

the upper layer has an extinction coefficient $k_U$ with respect to the exposure light which is greater than an extinction coefficient $k_L$ of the lower layer with respect to the exposure light.

(Structure 10)

The phase shift mask according to structure 9, wherein the phase shift film has a transmittance of 1% or more with respect to the exposure light.

(Structure 11)

The phase shift mask according to structure 9 or 10, wherein the extinction coefficient $k_L$ of the lower layer is 2.0 or less and the extinction coefficient $k_U$ of the upper layer is greater than 2.0.

(Structure 12)

The phase shift mask according to any one of structures 9 to 11, wherein the upper layer has a refractive index $n_U$ with respect to the exposure light which is smaller than a refractive index $n_L$ of the lower layer with respect to the exposure light and a ratio $n_U/n_L$ is 0.8 or more where the ratio is obtained by dividing the refractive index $n_U$ of the upper layer with respect to the exposure light by the refractive index $n_L$ of the lower layer with respect to the exposure light.

(Structure 13)

The phase shift mask according to structure 12, wherein the refractive index $n_L$ of the lower layer is 2.0 or less while the refractive index $n_U$ of the upper layer is smaller than 2.0.

(Structure 14)

The phase shift mask according to any one of structures 9 to 13, wherein the lower layer is formed of a material with the total content of chromium, oxygen, and carbon being 90 atomic % or more.

(Structure 15)

The phase shift mask according to any one of structures 9 to 14, wherein the upper layer is formed of a material with the total content of tantalum and silicon being 80 atomic % or more.

(Structure 16)

The phase shift mask according to any one of structures 9 to 15, wherein the phase shift film is formed of a material containing silicon.

(Structure 17)

A method for manufacturing a semiconductor device, comprising a step of transferring a transfer pattern by exposure to a resist film on a semiconductor substrate using the phase shift mask according to any one of structures 9 to 16.

Effect of the Disclosure

The mask blank according to this disclosure has, in the layered structure of the phase shift film and the light shielding film, a high optical density adapted to SMO, i.e., an optical density of 3.5 or more with respect to exposure light of an ArF excimer laser. Therefore, even in case where the phase shift mask manufactured using the mask blank is placed in the exposure apparatus of a complicated illumination system to which SMO is applied and transfer by exposure is carried out on the resist film of the transfer object, it is possible to increase the CD accuracy of the fine pattern formed on the resist film after developing treatment.

Furthermore, with the mask blank of this disclosure, when the fine pattern is formed on the light shielding film by dry etching, the CD accuracy of the fine pattern thus formed is high and the fine pattern formed on the light shielding film is sufficiently suppressed from being collapsed due to cleaning or the like.

The phase shift mask according to this disclosure is manufactured using the mask blank of this disclosure. Therefore, even in case where the phase shift mask is placed in the exposure apparatus of a complicated illumination system to which SMO is applied and transfer by exposure is carried out on the resist film of the transfer object, it is possible to increase the CD accuracy of the fine pattern formed on the resist film after developing treatment.

In the phase shift mask according to this disclosure, it is possible to form the fine pattern on the phase shift film with high accuracy because the phase shift mask is manufactured using the mask blank of this disclosure.

Furthermore, with the method for manufacturing a semiconductor device using the phase shift mask according to this disclosure, it is possible to transfer the fine pattern to the resist film on the semiconductor wafer with excellent CD accuracy.

MODE FOR EMBODYING THE DISCLOSURE

At first, description will be made about how to reach completion of this disclosure. The present inventors conducted a study about an optical density in a layered structure of a phase shift film and a light shielding film, which is required in order that, even in case where a phase shift mask is placed in an exposure apparatus having a complicated illumination system to which SMO is applied and transfer by exposure is carried out on a resist film formed on a semiconductor wafer or the like as a transfer object, a fine pattern formed on the resist film after developing treatment has a high CD accuracy. As a result, the inventors found out that, the optical density with respect to exposure light of an ArF excimer laser (hereinafter called ArF exposure light) in the layered structure of the phase shift film and the light shielding film (hereinafter simply called the optical density) must be equal to 3.5 or more.

Next, a further study was conducted assuming that a transmittance of the phase shift film with respect to the ArF exposure light is equal to 6% (optical density of about 1.2) which is a widely-used transmittance. In this case, the light shielding film must have an optical density of 2.3 or more with respect to the ArF exposure light. It was tried to form the light shielding film having an optical density of 2.3 or more using a chromium-based material. When a film thickness of the light shielding film was increased to obtain the optical density of 2.3 or more, there arose a need to considerably increase a film thickness of a resist pattern. As a result, it was difficult to form a fine pattern on the light shielding film by dry etching. Furthermore, it was tried to form a hard mask film of a silicon-based material on the light shielding film and to form a fine pattern on the light shielding film by dry etching using, as a mask, the hard mask film provided with a fine pattern. However, it has been found out that a side etching amount caused during formation of the fine pattern on the light shielding film is large and the fine pattern formed on the light shielding film is low in CD accuracy. Furthermore, after the fine pattern was formed on the light shielding film, cleaning was performed. This caused a phenomenon that the pattern on the light shielding film was detached. Even with this method, it was difficult to accurately form the fine pattern on the light shielding film.

A thin film of a chromium-based material tends to be increased in optical density per unit thickness as the content of chromium is increased. In view of this, the light shielding film was formed of a material having a considerably large chromium content such that the optical density was equal to 2.3 or more and a hard mask film of a silicon-based material was formed as a layer on the light shielding film. Then, it was confirmed whether or not the fine pattern can be formed on the light shielding film. However, the light shielding film had a very low etching rate for dry etching with a mixture of a chlorine-based gas and an oxygen gas, resulting in low in-plane CD uniformity of the pattern formed on the light shielding film. As a result of those studies, it has been found that the light shielding film having the optical density of 2.3 or more is practically difficult to be formed by the chromium-based material only.

In view of the above, it was tried to form the light shielding film with a layered structure comprising a lower layer of a chromium-based material and an upper layer of a metal silicide-based material. By forming, using the chromium-based material, the lower layer of the light shielding film that is disposed on the same side as the phase shift film, the lower layer has high etching resistance against dry etching with a fluorine-based gas, that is carried out when a fine pattern is formed on the phase shift film, and is given a function as a hard mask. Furthermore, the phase shift film has high etching resistance against dry etching with a mixture of a chlorine-based gas and an oxygen gas, that is carried out when the light shielding film is removed. Therefore, it is possible to reduce an influence on the phase shift film when the light shielding film is removed. On the other hand, by forming the upper layer of the light shielding film using the metal silicide-based material, the upper layer has high etching resistance against dry etching with a mixture of a chlorine-based gas and an oxygen gas, that is carried out when the fine pattern is formed on the lower layer of the light shielding film, and is given a function as a hard mask. In addition, it is possible to simultaneously remove the upper layer of the light shielding film during dry etching with a fluorine-based gas, that is carried out when the fine pattern is formed on the phase shift film.

It is not preferable that the lower layer of the light shielding film contains an element (such as silicon) which causes significant decrease in etching rate for dry etching with a mixture of a chlorine-based gas and an oxygen gas. In view of the above, the lower layer of the light shielding film is formed of a material containing chromium with a total content of chromium, oxygen, nitrogen, and carbon being equal to 90 atomic % or more. From the above-mentioned situation, it is difficult to increase the chromium content in the chromium-based material forming the lower layer of the light shielding film and there is a limit in increasing an extinction coefficient $k_L$ of the lower layer with respect to the ArF exposure light (hereinafter simply be called the extinction coefficient $k_L$). For the above-mentioned situation, it is effective to contain a large amount of oxygen in order to increase the etching rate of the thin film of the chromium-based material for dry etching with the mixture of the chlorine-based gas and the oxygen gas. However, oxygen is a factor to considerably decrease an extinction coefficient k of the thin film.

Heretofore, as the upper layer of the light shielding film, a material having the extinction coefficient k smaller than that of the lower layer is often used, taking into account that the upper layer is provided with an antireflection function. However, a recent improvement in performance of the exposure apparatus alleviates the constraint on a surface reflectance in a region (including a region where a light shielding zone is formed) outside a transfer pattern region. In view of the above, the light shielding film is given a structure that the upper layer has an extinction coefficient $k_U$ greater than the extinction coefficient $k_L$ of the lower layer.

The upper layer of the light shielding film is required to function as a hard mask when the lower layer of the chromium-based material is patterned by dry etching with the mixture of the chlorine-based gas and the oxygen gas. For an existing hard mask film of a silicon-based material, a silicon-based material containing a relatively large amount of oxygen and nitrogen is used partly because emphasis is placed on an increase in etching selectivity with respect to the thin film of the chromium-based material.

In this disclosure, the upper layer of the metal silicide-based material was lowered in content of oxygen and nitrogen than before and etching selectivity for dry etching with the mixture of the chlorine-based gas and the oxygen gas with respect to the lower layer of the chromium-based material was examined. As a result, it has been found that even the upper layer of the metal silicide-based material containing substantially no oxygen and nitrogen (but oxidation proceeds in a surface layer adjacent to air) fully functions as the hard mask when the lower layer of the chromium-based material is patterned by dry etching with the mixture of the chlorine-based gas and the oxygen gas. In order to suppress an increase in total film thickness of the light shielding film due to formation of the upper layer, it is necessary to increase the extinction coefficient $k_U$ of the upper layer. From these studies, the upper layer of the light shielding film is formed of a material containing metal and silicon with a total content of metal and silicon being 80 atomic % or more.

As a result of the diligent studies described above, the mask blank of this disclosure has been completed. Specifically, a mask blank has a structure in which a phase shift film and a light shielding film are formed as layers on a transparent substrate in this order, wherein the layered structure of the phase shift film and the light shielding film has an optical density of 3.5 or more with respect to exposure light of an ArF excimer laser; the light shielding film has a structure in which a lower layer and an upper layer are formed as layers from the side of the transparent substrate; the lower layer is formed of a material containing chromium with a total content of chromium, oxygen, nitrogen, and carbon being 90 atomic % or more; the upper layer is formed of a material containing metal and silicon with a total content of metal and silicon being 80 atomic % or more; and the upper layer has an extinction coefficient $k_U$ with respect to the exposure light which is greater than an extinction coefficient $k_L$ of the lower layer with respect to the exposure light.

Hereinafter, with reference to the drawings, description will be made of a detailed structure of this disclosure mentioned above. In the figures, similar components are assigned with the same reference numeral and described.

<Mask Blank>

Figure 1:
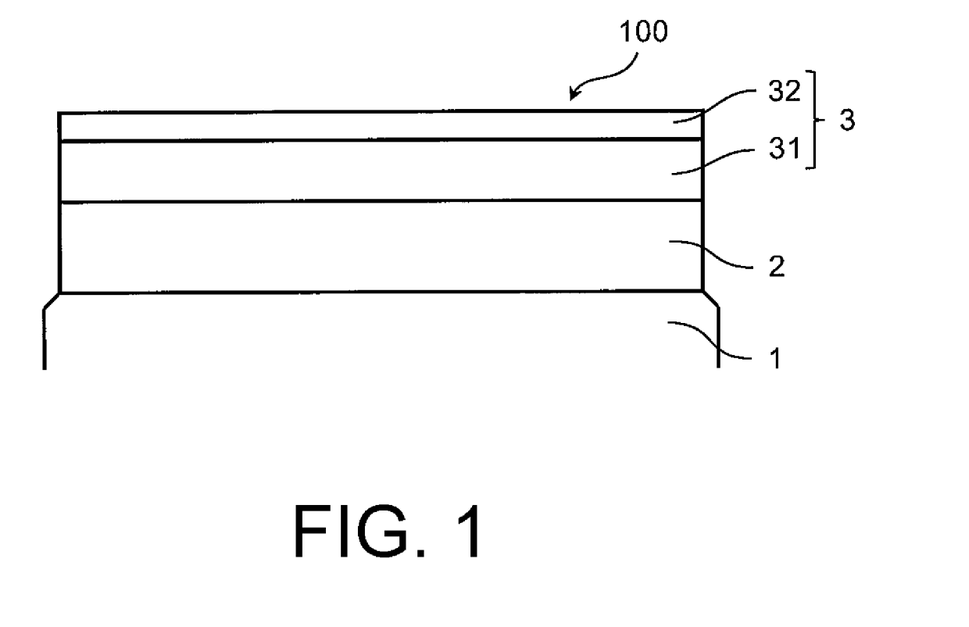
FIG. 1 is a schematic sectional view for illustrating a mask blank according to an embodiment of this disclosure.

FIG. 1 is a view for illustrating a schematic structure of an embodiment of a mask blank. The mask blank 100 illustrated in FIG. 1 has a structure in which a phase shift film 2, a lower layer 31 of a light shielding film 3, and an upper layer 32 of the light shielding film 3 are formed as layers on one main surface of a transparent substrate 1 in this order. The mask blank 100 may have a structure in which a resist film is formed as a layer on the upper layer 32 if necessary. From the above-mentioned reason, the mask blank 100 is necessary at least to have an optical density of 3.5 or more with respect to ArF exposure light in a layered structure of the phase shift film 2 and the light shielding film 3. The mask blank 100 preferably has an optical density of 3.8 or more with respect to the ArF exposure light in the layered structure of the phase shift film 2 and the light shielding film 3, more preferably 4.0 or more. Hereinafter, details of main parts of the mask blank 100 will be described.

[Transparent Substrate]

The transparent substrate 1 is formed of a material excellent in transmissivity with respect to exposure light used in an exposure process in lithography. As such a material, synthetic quartz glass, aluminosilicate glass, soda lime glass, low thermal expansion glass ($SiO_2$—$TiO_2$ glass or the like) or other various glass substrates may be used. In particular, a substrate using synthetic quartz glass has high transparency to the ArF exposure light and, therefore, is suitably used as the transparent substrate 1 of the mask blank 100.

It is assumed that the exposure process in lithography referred to herein is an exposure process in lithography carried out by the use of a phase shift mask manufactured using the mask blank 100 and that exposure light in the following is an ArF excimer laser (having a wavelength of 193 nm) used in the exposure process.

[Phase Shift Film]

The phase shift film 2 has a function of transmitting the ArF exposure light at an intensity which does not substantially contribute to exposure and causing the ArF exposure light having been transmitted therethrough to have a predetermined phase difference with respect to exposure light having passed through air by a distance equal to a film thickness of the phase shift film 2. Specifically, the phase shift film 2 is patterned to form a part and another part where the phase shift film 2 remains and does not remain, respectively, so that the light having been transmitted through the phase shift film 2 (light having an intensity which does not substantially contribute to exposure) has a phase in a substantially inverted relation to that of the exposure light having been transmitted through the part without the phase shift film 2. In this manner, lights each intruding into a region of the other light due to a diffraction phenomenon cancel each other to achieve a so-called phase shift effect, i.e., an effect of making a light intensity at a pattern boundary portion of the phase shift film 2 be substantially equal to zero so as to improve a contrast, namely, a resolution at the pattern boundary portion.

The phase shift film 2 preferably has a transmittance of 1% or more with respect to the ArF exposure light, more preferably 2% or more. The phase shift film 2 preferably has a transmittance of 35% or less with respect to the ArF exposure light, more preferably 30% or less. The phase shift film 2 preferably has the above-mentioned phase difference of 150 degrees or more, more preferably 160 degrees or more. The phase shift film 2 preferably has the above-mentioned phase difference of 200 degrees or less, more preferably 190 degrees or less.

Herein, the phase shift film 2 is formed of a material containing silicon (Si). The phase shift film 2 is preferably formed of a material containing nitrogen (N) in addition to silicon. The phase shift film 2 can be patterned by dry etching with a fluorine-based gas and has sufficient etching selectivity with respect to the lower layer 31 of a Cr-based material forming the light shielding film 3 which will later be described.

The phase shift film 2 is preferably formed of a material consisting of silicon and nitrogen, or a material containing one or more element selected from metalloid elements and non-metal elements in addition to the material consisting of silicon and nitrogen. The phase shift film 2 may contain any metalloid element in addition to silicon and nitrogen. Among the metalloid elements, it is preferable to contain one or more elements selected from boron (B), germanium (Ge), antimony (Sb), and tellurium (Te) because an increase in conductivity of silicon used as a sputtering target is expected. The phase shift film 2 may contain any non-metal element in addition to silicon and nitrogen. It is noted here that the non-metal elements in this disclosure include narrow-sense non-metal elements (nitrogen (N), carbon (C), oxygen (O), phosphorus (P), sulfur (S), selenium (Se)), halogen, and noble gases. Among the non-metal elements, it is preferable to contain one or more element selected from carbon, fluorine (F), and hydrogen (H).

The phase shift film 2 may contain a noble gas (also referred to as a rare gas; hereinafter, the same applies in the present specification). The noble gas is an element capable of increasing a film forming rate to improve productivity by presence in a film forming chamber when the phase shift film 2 is formed by reactive sputtering. The noble gas is turned into plasma which collides with a target so that target constituting elements are ejected from the target, capture a reactive gas in a route to reach the transparent substrate 1, and are adhered to the transparent substrate 1. As a result, the phase shift film 2 is formed on the transparent substrate 1. During a period after the target constituting elements are ejected from the target and before the target constituting elements are adhered to the transparent substrate 1, the noble gas in the film forming chamber is slightly captured. As the noble gas required for the reactive sputtering, argon (Ar), krypton (Kr), and xenon (Xe) are preferable. In order to relax a stress of the phase shift film 2, helium (He) and neon (Ne) each of which has a small atomic weight may positively be captured into the phase shift film.

The phase shift film 2 may further contain a metal element if patterning by dry etching using a fluorine-based gas is possible. As the metal element to be contained, molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), and aluminum (Al) are given by way of example.

The phase shift film 2 preferably has a thickness of 90 nm or less. If the thickness of the phase shift film 2 is greater than 90 nm, patterning by dry etching with a fluorine-based gas requires a long time. More preferably, the phase shift film 2 has a thickness of 80 nm or less. On the other hand, the phase shift film 2 preferably has a thickness of 40 nm or more. If the thickness of the phase shift film 2 is smaller than 40 nm, a predetermined transmittance and a predetermined phase difference required as the phase shift film may not be obtained.

[Light Shielding Film]

The light shielding film has a structure in which the lower layer 31 and the upper layer 32 are formed as layers in this order from the side of the phase shift film 2. The lower layer 31 is formed of a material containing chromium with a total content of chromium, oxygen, nitrogen, and carbon being 90 atomic % or more. The lower layer 31 is preferably formed of a material containing chromium with a total content of chromium, oxygen, nitrogen, and carbon being 95 atomic % or more, more preferably formed of such a material with the total content of 98 atomic % or more. This is because the content of the other elements (in particular, silicon) than those mentioned above is preferably reduced in order to increase an etching rate for dry etching using the mixture of the chlorine-based gas and the oxygen gas.

The lower layer 31 may contain metal elements, metalloid elements, and non-metal elements other than the above-mentioned constituent elements as far as the above-mentioned range of the total content is satisfied. The metal elements in this case include molybdenum, indium, tin, and so on. The metalloid elements in this case include boron, germanium, and so on. The non-metal elements in this case include narrow-sense non-metal elements (phosphorus, sulfur, selenium), halogens (fluorine, chlorine, and so on), noble gases (helium, neon, argon, krypton, xenon, and so on). In particular, the noble gas is an element slightly captured into the film when the lower layer 31 is formed by sputtering and is an element which may be advantageous when it is positively contained in the layer. However, the content of silicon in the lower layer 31 is required to be 3 atomic % or less, preferably 1 atomic % or less, and more preferably a detection limit value or less.

The lower layer 31 is preferably formed of a material containing chromium with a total content of chromium, oxygen, and carbon being 90 atomic % or more. The lower layer 31 is preferably formed of a material containing chromium with a total content of chromium, oxygen, and carbon being 95 atomic % or more, more preferably formed of such a material with the total content of 98 atomic % or more. As the content of nitrogen in the lower layer 31 is increased, the etching rate for dry etching using the mixture of the chlorine-based gas and the oxygen gas is increased but the amount of side etching also increases. Taking into account that the etching rate for dry etching using the mixture of the chlorine-based gas and the oxygen gas is not increased as compared with the case where the lower layer 31 contains oxygen, the content of nitrogen in the lower layer 31 is preferably reduced. In the lower layer 31, the content of nitrogen is preferably smaller than 10 atomic %, more preferably 5 atomic % or less, further preferably 2 atomic % or less. As the lower layer 31, an embodiment is included which is substantially formed of chromium, oxygen, and carbon and does not substantially contain nitrogen.

In the lower layer 31, the content of chromium is preferably 50 atomic % or more. This is because, in the light shielding film 3, a material having a high optical density is selected for the upper layer 32 while a certain level of optical density is preferably assured for the lower layer 31 also. This is also for purpose of suppressing side etching caused when the lower layer 31 is patterned by dry etching. On the other hand, the lower layer 31 preferably has a chromium content of 80 atomic % or less, more preferably 75 atomic % or less. This is for the purpose of assuring a sufficient etching rate when the light shielding film 3 is patterned by dry etching.

In the lower layer 31, the content of oxygen is preferably 10 atomic % or more, more preferably 15 atomic % or more. This is for the purpose of assuring a sufficient etching rate when the light shielding film 3 is patterned by dry etching. On the other hand, in the lower layer 31, the content of oxygen is preferably 50 atomic % or less, more preferably 40 atomic % or less, further preferably 35 atomic % or less. This is because, like in the foregoing, it is preferable to assure a certain level of optical density in the lower layer 31 also. This is also for the purpose of suppressing side etching caused when the lower layer 31 is patterned by dry etching.

In the lower layer 31, the content of carbon is preferably 10 atomic % or more. This is for the purpose of suppressing side etching caused when the lower layer 31 is patterned by dry etching. On the other hand, in the lower layer 31, the content of carbon is preferably 30 atomic % or less, more preferably 25 atomic % or less, further preferably 20 atomic % or less. This is for the purpose of assuring a sufficient etching rate when the light shielding film 3 is patterned by dry etching. In the lower layer 31, a difference in content of each element forming the lower layer 31 in a film thickness direction is preferably smaller than 10%. This is for the purpose of reducing variation of the etching rate in the film thickness direction when the lower layer 31 is patterned by dry etching.

The lower layer 31 preferably has a thickness greater than 15 nm, more preferably 18 nm or more, further preferably 20 nm or more. On the other hand, the lower layer 31 preferably has a thickness of 60 nm or less, more preferably 50 nm or less, further preferably 45 nm or less. In the light shielding film 3, a material having a high optical density is selected for the upper layer 32. However, there is a limit on increasing the degree of contribution of the upper layer 32 to the optical density required for a whole of the light shielding film 3. Therefore, it is necessary to assure a certain level of optical density in the lower layer 31 also. In the lower layer 31, the etching rate for dry etching using the mixture of the chlorine-based gas and the oxygen gas must be increased. Accordingly, there is a limit on increasing light shielding performance. Therefore, the lower layer 31 must have a predetermined thickness or more. On the other hand, if the thickness of the lower layer 31 is too large, it is difficult to suppress occurrence of side etching. The range of thickness of the lower layer 31 is determined taking those constraints into consideration.

The upper layer 32 is formed of a material containing metal and silicon with a total content of metal and silicon being 80 atomic % or more. The upper layer 32 is preferably formed of a material with a total content of metal and silicon being 85 atomic % or more, more preferably formed of such a material with the total content of 90 atomic % or more. Among the elements constituting the upper layer 32, metal and silicon are elements improving light shielding performance of the upper layer 32 with respect to the ArF exposure light. As described above, it has been found out that, even if the total content of metal and silicon in the upper layer 32 is increased, the upper layer has a high resistance against dry etching with the mixture of the chlorine-based gas and the oxygen gas that is carried out when the fine pattern is formed on the lower layer 31, and can function as a hard mask. On the other hand, a surface of the upper layer 32 on the opposite side to the phase shift film 2 is a surface brought into contact with air and a surface layer including that surface is easily oxidized. Therefore, it is difficult to form a whole of the upper layer 32 only by metal and silicon. On the other hand, the upper layer 32 is desired to have higher light shielding performance than that of the lower layer 31. Taking the above into consideration, the upper layer 32 is desired to be formed of a material with a total content of metal and silicon being 80 atomic % or more in an average of the whole layer, preferably 85 atomic % or more, further preferably 90 atomic % or more.

As the metal element contained in the upper layer 32, one or more metal elements are preferably selected from molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), rhodium (Rh), palladium (Pd), indium (In), tin (Sn), and aluminum (Al). More preferably, the metal element contained in the upper layer 32 is tantalum. Tantalum is an element which has a large atomic weight and high light shielding performance and which is high in resistance against a cleaning liquid used in a cleaning process performed during manufacture of the phase shift mask from the mask blank and a cleaning liquid used in cleaning performed on the phase shift mask. The upper layer 32 is preferably formed of a material with a total content of tantalum and silicon being 80 atomic % or more, more preferably 85 atomic % or more, further preferably 90 atomic % or more.

The upper layer 32 may contain a metalloid element and a non-metal element other than the above-mentioned constituent elements as far as the above-mentioned range of the total content is satisfied. The metalloid elements in this case include boron, germanium, and so on. The non-metal elements in this case include narrow-sense non-metal elements (oxygen, nitrogen, carbon, phosphorus, sulfur, selenium), halogen (fluorine, chlorine, and so on), and a noble gas (helium, neon, argon, krypton, xenon, and so on). In particular, the noble gas is an element slightly captured into the film when the upper layer 32 is formed by sputtering and is an element which may be advantageous when it is positively contained in the layer.

In the upper layer 32, a ratio obtained by dividing the content [atomic %] of metal by the total content [atomic %] of metal and silicon (that is, a ratio of the content M [atomic %] of metal when the total content [M+Si] [atomic %] of metal and silicon in the upper layer 32 is defined as 100; the ratio is represented by [%]; hereinafter, the ratio will be referred to as M/(M+Si) ratio) is preferably 5% or more, more preferably 10% or more, further preferably 15% or more. In the upper layer 32, the M/[M+Si] ratio is preferably 60% or less, more preferably 55% or less, further preferably 50% or less. A thin film of a metal silicide-based material often tends to be increased in light shielding performance (optical density) as a content ratio of metal and silicon approaches a stoichiometrically stable ratio. In case of the thin film of the metal silicide-based material, the stoichiometrically stable ratio is often obtained when metal:silicon is 1:2. The above-mentioned M/[M+Si] ratio of the upper layer 32 is determined taking into such tendency into consideration.

The upper layer 32 preferably has a thickness of 5 nm or more, more preferably 7 nm or more, further preferably 10 nm or more. On the other hand, the upper layer 32 preferably has a thickness of 40 nm or less, more preferably 35 nm or less, and further preferably 30 nm or less. The degree of contribution of the upper layer 32 with respect to the optical density required for a whole of the light shielding film 3 must be higher than the degree of contribution of the lower layer 31. Furthermore, there is a limit on increasing the optical density of the upper layer 32 per unit thickness. On the other hand, in the upper layer 32, it should be possible to form a fine pattern by dry etching using, as a mask, a resist film provided with a fine pattern. Therefore, a limit is imposed on increasing the thickness of the upper layer 32. The range of the thickness of the upper layer 32 is determined taking into these constraints into consideration. The thickness of the upper layer 32 is preferably smaller than the thickness of the lower layer 31.

In the upper layer 32, the fine pattern is formed by dry etching using, as a mask, the resist film provided with the fine pattern. The upper layer 32 has a surface which tends to be low in adhesion with the resist film of an organic material. Therefore, the surface of the upper layer 32 is preferably subjected to HMDS (Hexamethyldisilazane) treatment to improve the adhesion of the surface.

From the above-mentioned reason, the extinction coefficient $k_U$ of the upper layer 32 of the light shielding film 3 is required to be greater than the extinction coefficient $k_L$ of the lower layer 31. The extinction coefficient $k_L$ of the lower layer 31 is preferably 2.00 or less, more preferably 1.95 or less, further preferably 1.90 or less. The extinction coefficient $k_L$ of the lower layer 31 is preferably 1.20 or more, more preferably 1.25 or more, further preferably 1.30 or more. On the other hand, the extinction coefficient $k_U$ of the upper layer 32 is preferably greater than 2.00, more preferably 2.10 or more, further preferably 2.20 or more. The extinction coefficient $k_U$ of the upper layer 32 is preferably 3.20 or less, more preferably 3.10 or less, further preferably 3.00 or less.

The phase shift film 2 must have both a function of transmitting the transmitted exposure light at a predetermined transmittance and a function of causing the transmitted exposure light to have a predetermined phase difference. The phase shift film 2 is required to achieve those functions with a smaller film thickness. Therefore, the phase shift film 2 is often formed of a material having a large refractive index n. On the other hand, in the lower layer 31 of the light shielding film 3, the content of chromium is relatively large under the above-mentioned circumstance while the content of nitrogen is small which is an element having a tendency to increase the refractive index n of the material when it is contained in the material. Therefore, the lower layer 31 is smaller in refractive index n than the phase shift film 2. On the other hand, the upper layer 32 of the light shielding film 3 is required to be significantly increased in light shielding performance. Therefore, the content of nitrogen is desired to be smaller than that in the lower layer 31. Under the circumstances, the mask blank 100 has a layered structure in which the refractive index n becomes smaller in the order of the phase shift film 2, the lower layer 31, and the upper layer 32.

Generally, in a structure in which a film having a large refractive index n and a film having a small refractive index n are formed as layers, when light passing through the inside of the film having the large refractive index n is incident to an interface between the film having the large refractive index n and the film having the small refractive index n at a predetermined incident angle from a direction perpendicular to the interface, the light enters from the interface at an outgoing angle greater than the incident angle into the film having the small refractive index n. As the difference in refractive index between the film having the large refractive index n and the film having the small refractive index n is greater, a difference between the incident angle and the outgoing angle is increased. Therefore, the exposure light advancing with an inclination at a predetermined angle from the direction perpendicular to the interface of the phase shift film 2 is increased in inclination angle from the direction perpendicular to the interface when the exposure light enters from the phase shift film 2 into the lower layer 31 of the light shielding film 3. Furthermore, the exposure light having entered into the lower layer 31 is further increased in inclination angle from the direction perpendicular to the interface when the exposure light enters into the upper layer 32.

In case where the light shielding zone is formed in such light shielding film 3, when the exposure light complicated in irradiation angle due to SMO advances from the lower layer 31 to the upper layer 32, the inclination angle from the direction perpendicular to the interface therebetween is increased. This results in easy occurrence of a phenomenon that leaking light with a light intensity not sufficiently attenuated is emitted from a side wall of the upper layer 32 provided with the light shielding zone. In order to reduce the leaking light resulting from the above-mentioned phenomenon, the upper layer 32 preferably has a refractive index $n_U$ smaller than a refractive index $n_L$ of the lower layer 31 (i.e., a ratio $n_U/n_L$ obtained by dividing the refractive index $n_U$ of the upper layer 32 by the refractive index $n_L$ of the lower layer 31 is smaller than 1.0) and the ratio $n_U/n_L$ obtained by dividing the refractive index $n_U$ of the upper layer 31 by the refractive index $n_L$ of the lower layer 31 is preferably 0.8 or more. The ratio $n_U/n_L$ obtained by dividing the refractive index $n_U$ of the upper layer 32 by the refractive index $n_L$ of the lower layer 31 is more preferably 0.85 or more, further preferably 0.9 or more.

From the above-mentioned reason, the refractive index $n_L$ of the lower layer 31 is preferably 2.00 or less, more preferably 1.98 or less, further preferably 1.95 or less. The refractive index $n_L$ of the lower layer 31 is preferably 1.45 or more, more preferably 1.50 or more, further preferably 1.55 or more. On the other hand, the refractive index $n_U$ of the upper layer 32 is preferably smaller than 2.00, more preferably 1.95 or less, further preferably 1.90 or less. The refractive index $n_U$ of the upper layer 32 is preferably 1.30 or more, more preferably 1.35 or more, further preferably 1.40 or more.

In an exposure process in lithography, it is desired that, in order to avoid a defect in transfer by exposure due to reflection of the ArF exposure light, a surface reflectance for the exposure light at both main surfaces of the phase shift mask is not too high. In particular, at the surface of the light shielding film (the surface farthest from the transparent substrate) on the side irradiated by reflected light of the exposure light from a reduction optical system of the exposure apparatus, the reflectance is desirably, for example, 60% or less (preferably 55% or less). This is for the purpose of suppressing stray light generated by multiple reflection between the surface of the light shielding film and a lens of the reduction optical system.

In the light shielding film 3, the layered structure of the lower layer 31 and the upper layer 32 preferably has a thickness of 80 nm or less, more preferably 75 nm or less, further preferably 70 nm or less. In the light shielding film 3, the layered structure of the lower layer 31 and the upper layer 32 preferably has a thickness of 30 nm or more, more preferably 35 nm or more, further preferably 40 nm or more. If the total thickness of the light shielding film 3 is too large, it is difficult to form the fine pattern on the light shielding film with high accuracy. On the other hand, if the total thickness of the light shielding film 3 is too small, it is difficult to satisfy the optical density required to the light shielding film 3.

The phase shift film 2, and the lower layer 31 and the upper layer 32 of the light shielding film 3 may be formed by sputtering. As the sputtering, sputtering using a direct current (DC) power supply, sputtering using a radio frequency (RF) power supply, magnetron sputtering, or a conventional method is applicable. The DC sputtering is preferable because of a simple mechanism. Use of magnetron is preferable because a film forming rate is increased and productivity is improved. A film forming apparatus may be of an inline type or a single wafer type.

[Resist Film]

In the mask blank 100, a resist film of an organic material with a film thickness of 100 nm or less is preferably formed in contact with the surface of the upper layer 32 of the light shielding film 3. In this case, the resist film is preferably applied and formed after the surface of the upper layer 32 is subjected to HMDS treatment. The upper layer 32 is made of a material which can be patterned to form the fine pattern by dry etching with a fluorine gas. The upper layer 32 functions as a hard mask during dry etching with the mixture of the chlorine-based gas and the oxygen gas, which is performed when the lower layer 31 is patterned to form the fine pattern. Therefore, the fine pattern can be formed on the light shielding film 3 even if the resist film has a film thickness of 100 nm or less. More preferably, the resist film has a film thickness of 80 nm or less. The resist film is preferably formed of a resist for electron beam writing and exposure. Further preferably, the resist is of a chemically-amplified type.

The mask blank 100 mentioned above has a high optical density adapted to SMO, i.e., an optical density of 3.5 or more with respect to the exposure light of the ArF excimer laser in the layered structure of the phase shift film 2 and the light shielding film 3. Therefore, when the phase shift mask manufactured from the mask blank 100 is placed in the exposure apparatus having a complicated illumination system to which SMO is applied and a resist film of a transfer object is subjected to transfer by exposure, it is possible to increase the CD accuracy of a fine pattern formed on the resist film after developing treatment. In the mask blank 100, when the fine pattern is formed on the light shielding film 3 by dry etching, the fine pattern thus formed has a high CD accuracy and the fine pattern of the light shielding film 3, thus formed, is sufficiently prevented from being collapsed due to cleaning or the like.

<Method for Manufacturing Mask Blank>

The mask blank 100 having the above-mentioned structure is manufactured in the following steps. At first, the transparent substrate 1 is prepared. The transparent substrate 1 has end surfaces and main surfaces which are polished to a predetermined surface roughness (for example, root-mean-square roughness Rq is 0.2 nm or less in an inner region of a 1 m square), and is thereafter subjected to predetermined cleaning treatment and predetermined drying treatment.

Next, the phase shift film 2 is formed on the transparent substrate 1 by sputtering. After the phase shift film 2 is formed, annealing treatment at a predetermined heating temperature is carried out as post-processing. Next, the lower layer 31 of the light shielding film 3 mentioned above is formed on the phase shift film 2 by sputtering. Then, the upper layer 32 mentioned above is formed on the lower layer 31 by sputtering. Formation of each layer by sputtering is carried out by using a sputtering target containing the materials constituting each layer at a predetermined composition ratio and a sputtering gas and, if necessary, by using as a sputtering gas the above-mentioned mixture of the noble gas and the reactive gas. Thereafter, if the mask blank 100 has the resist film, the surface of the upper layer 32 is subjected to HMDS treatment if necessary. Then, by a coating method such as spin coating, the resist film is formed on the surface of the upper layer 32 having been subjected to HMDS treatment to complete the mask blank 100.

<Method for Manufacturing Phase Shift Mask and Phase Shift Mask>

Next, a method for manufacturing a halftone phase shift mask using the mask blank 100 having the structure illustrated in FIG. 1 will be described with reference to the schematic sectional views in FIGS. 2A to 2H for illustrating a manufacturing process of the phase shift mask.

At first, the surface of the upper layer 32 of the light shielding film 3 in the mask blank 100 is subjected to HMDS treatment. Next, the resist film is formed by spin coating on the upper layer 32 after HMDS treatment. Next, to the resist film, a first pattern (phase shift pattern, transfer pattern) to be formed on the phase shift film 2 is written by exposure with electron beam. Thereafter, the resist film is subjected to predetermined treatments, such as PEB (post exposure bake) treatment, developing treatment, and post bake treatment to form the first pattern (phase shift pattern) (resist pattern 4*a*) on the resist film (see FIG. 2A). The first pattern written by exposure is a pattern optimized by applying SMO.

Figure 2A:
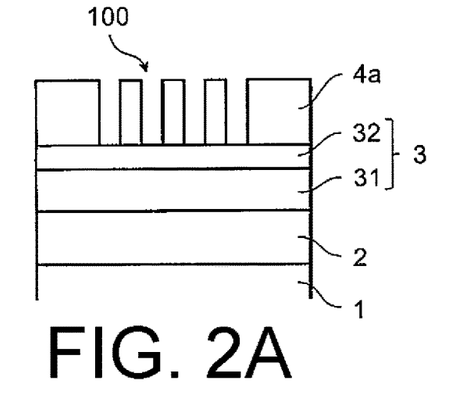
FIGS. 2A to 2H are schematic sectional views for illustrating a manufacturing process of a phase shift mask according to an embodiment of this disclosure.
Figure 2B:
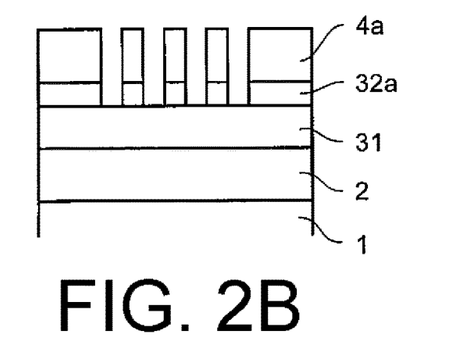
Figure 2C:
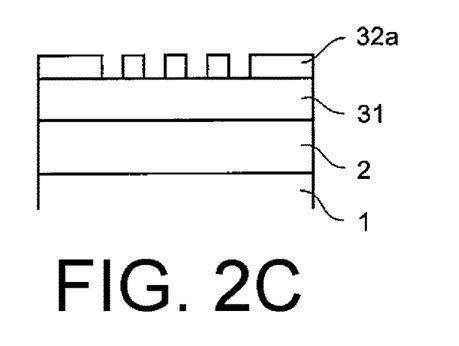

Next, with the resist pattern 4*a* used as a mask, the upper layer 32 of the light shielding film 3 is subjected to dry etching using a fluorine-based gas to form a first pattern (upper layer pattern 32*a*) on the upper layer 32 (see FIG. 2B). Thereafter, the resist pattern 4*a* is removed (see FIG. 2C). It is noted here that the lower layer 31 of the light shielding film 3 may be subjected to dry etching while the resist pattern 4*a* remains unremoved. In this case, the resist pattern 4*a* disappears when the lower layer 31 is subjected to dry etching.

Figure 2D:
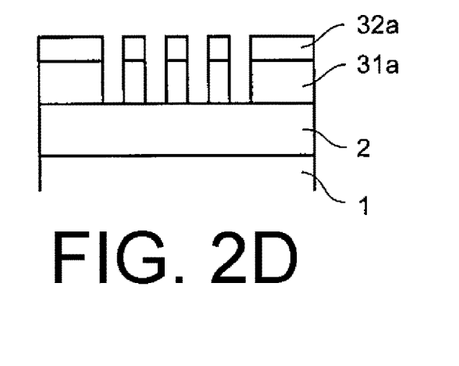
Figure 2E:
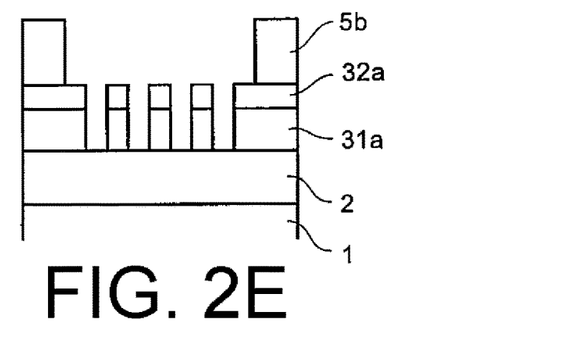

Next, with the upper layer pattern 32*a* used as a mask, high-bias etching using the mixture of the chlorine-based gas and the oxygen gas is carried out to form a first pattern (lower layer pattern 31*a*) on the lower layer 31 (see FIG. 2D). In dry etching for the lower layer 31, an etching gas higher in mixing ratio of the chlorine-based gas than before is used. The mixing ratio of the mixture of the chlorine-based gas and the oxygen gas in dry etching of the lower layer 31 is preferably: chlorine-based gas:oxygen gas=10 or more:1 in a gas flow rate ratio inside an etching apparatus, more preferably 15 or more: 1, further preferably 20 or more:1. By using the etching gas having a high mixing ratio of the chlorine-based gas, it is possible to enhance anisotropy of dry etching. Furthermore, in dry etching for the lower layer 31, the mixing ratio of the mixture of the chlorine-based gas and the oxygen gas is preferably: chlorine-based gas:oxygen gas=40 or less:1 in a gas flow rate ratio inside an etching chamber.

In dry etching for the lower layer 31, a bias voltage applied to a back surface of the transparent substrate 1 is higher than before. Although the effect of increasing the bias voltage is different depending on the etching apparatus, electric power upon application of the bias voltage is preferably 15 [W] or more, more preferably 20 [W] or more, further preferably 30 [W] or more. By increasing the bias voltage, it is possible to enhance anisotropy of dry etching with the mixture of the chlorine-based gas and the oxygen gas.

Next, the resist film is formed on the upper layer pattern 32*a* and the phase shift film 2 by spin coating. To the resist film, a second pattern (pattern including a light shielding zone pattern) to be formed on the light shielding film 3 is written by exposure with electron beam. Thereafter, predetermined treatments such as developing treatment are carried out to form the resist film having a second pattern (light shielding pattern) (resist pattern 5b) (see FIG. 2E).

Subsequently, dry etching using a fluorine-based gas is carried out to form the first pattern (phase shift pattern 2a) on the phase shift film 2 with the lower layer pattern 31a used as a mask and to form a second pattern (upper layer pattern 32b) on the upper layer pattern 32a with the resist pattern 5b used as a mask (see FIG. 2F). Thereafter, the resist pattern 5b is removed. It is noted here that dry etching of the lower layer pattern 31a of the light shielding film 3, which will later be described, may be carried out while the resist pattern 5b remains unremoved. In this case, the resist pattern 5b disappears when the lower layer pattern 31a is subjected to dry etching.

Figure 2F:
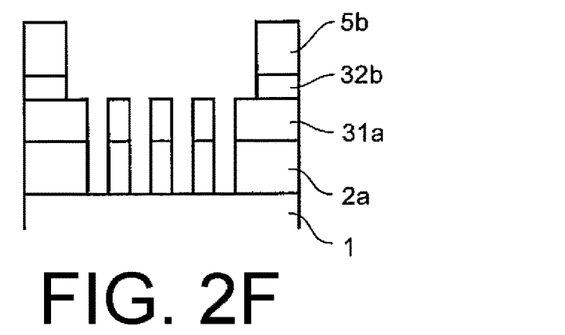
Figure 2G:
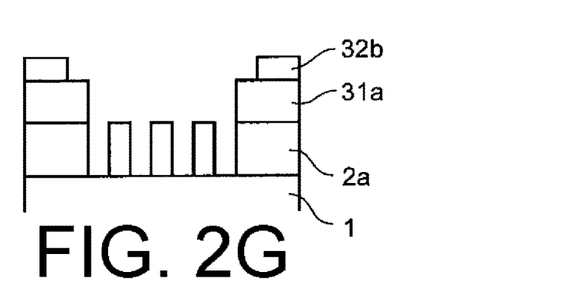
Figure 2H:
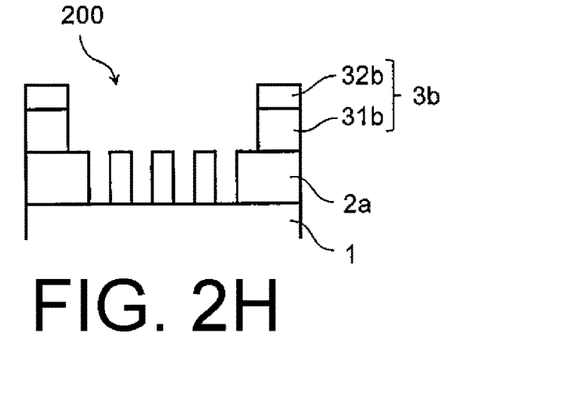

Next, with the upper layer pattern 32b used as a mask, dry etching using the mixture of the chlorine-based gas and the oxygen gas is carried out to form a second pattern (lower layer pattern 31b) on the lower layer pattern 31a (see FIGS. 2G and 2H). It is noted here that dry etching of the lower layer pattern 31a may be carried out in conventional conditions for the mixing ratio of the chlorine-based gas and the oxygen gas and the bias voltage. Finally, through predetermined treatments such as cleaning, a phase shift mask 200 is obtained (see FIG. 2H).

As the chlorine-based gas used in dry etching during the above-mentioned manufacturing process, no particular limitation is imposed as far as Cl is contained. For example, the chlorine-based gas may be $Cl_2$, $SiH_2Cl_2$, $CHCl_3$, $CH_2Cl_2$, $CCl_4$, $BCl_3$, and so on. As the fluorine-based gas used in dry etching during the above-mentioned manufacturing process, no particular limitation is imposed as far as F is contained. For example, the fluorine-based gas may be $CHF_3$, $CF_4$, $C_2F_6$, $C_4F_8$, $SF_6$, and so on. In particular, the fluorine-based gas which does not contain C is relatively low in etching rate for a glass substrate and is capable of reducing damage to the glass substrate.

The phase shift mask 200 manufactured through the above-mentioned process has a structure in which the phase shift film having the transfer pattern (phase shift pattern 2a) and the light shielding film having the light shielding pattern (light shielding pattern 3b) are formed as layers on the transparent substrate 1 in this order (see FIG. 2H). The phase shift mask is manufactured from the mask blank 100 and, therefore, has a characteristic same as that of the mask blank 100. Specifically, the phase shift mask 200 has a structure in which the phase shift film 2 having the transfer pattern and the light shielding film 3 having the light shielding zone pattern are formed as layers on the transparent substrate 1 in this order and is characterized in that the layered structure of the phase shift film 2 and the light shielding film 3 has an optical density of 3.5 or more with respect to the exposure light of the ArF excimer laser, that the light shielding film 3 has a structure in which the lower layer 31 and the upper layer 32 are formed as layers from the side of the transparent substrate 1, that the lower layer 31 is formed of the material containing chromium with the total content of chromium, oxygen, nitrogen, and carbon being equal to 90 atomic % or more, that the upper layer 32 is formed of a material containing metal and silicon with the total content of metal and silicon being equal to 80 atomic % or more, and that the extinction coefficient $k_U$ of the upper layer 32 with respect to the exposure light is greater than the extinction coefficient $k_L$ of the lower layer 31 with respect to the exposure light.

The phase shift mask 200 is manufactured using the mask blank 100. Therefore, even in case where the phase shift mask 200 is placed in the exposure apparatus having a complicated illumination system to which SMO is applied and transfer by exposure is carried out on the resist film of the transfer object, it is possible to increase the CD accuracy of the fine pattern formed on the resist film after developing treatment.

<Method for Manufacturing Semiconductor Device>

Next, description will be made of a method for manufacturing a semiconductor device using the above-mentioned phase shift mask 200. The method for manufacturing a semiconductor device is characterized in that the transfer pattern (phase shift pattern 2a) of the phase shift mask 200 is transferred by exposure to the resist film on the semiconductor substrate by using the above-mentioned phase shift mask 200. The method for manufacturing a semiconductor device is carried out in the following manner.

At first, a substrate on which a semiconductor device is to be formed is prepared. For example, the substrate may be a semiconductor substrate or a substrate having a semiconductor thin film. Furthermore, a microfabricated film may be formed on an upper part of those substrates. The resist film is formed on the prepared substrate. To the resist film, reduction transfer by exposure is repeatedly carried out using the above-mentioned phase shift mask 200. In this manner, the transfer pattern formed on the phase shift mask 200 is arranged on the resist film without gaps. The exposure apparatus used herein is capable of emitting the ArF exposure light with the illumination system optimum to the phase shift mask 200 having the phase shift pattern 2a optimized by applying SMO.

Furthermore, various processes are carried out, such as formation of the resist pattern by developing treatment of the resist film having the transfer pattern transferred by exposure, etching performed on the surface layer of the substrate with the resist pattern used as a mask, and introduction of impurities. After completion of those processes, the resist pattern is removed. The above-mentioned processes are repeatedly carried out on the substrate while the transfer masks are exchanged. Furthermore, any necessary process is performed. Thus, the semiconductor device is completed.

In the above-mentioned manufacture of the semiconductor device, by using the exposure apparatus capable of emitting the ArF exposure light with the complicated but optimum illumination system to the phase shift mask 200 with the phase shift pattern 2a optimized by applying SMO, transfer by exposure is repeatedly performed on the resist film on the semiconductor substrate. Therefore, the fine pattern can be transferred by exposure to the resist film with high accuracy. Furthermore, in the phase shift mask 200, the layered structure of the phase shift pattern 2a and the light shielding pattern 3b, which constitutes the light shielding zone, has the optical density of 3.5 or more significantly higher than before with respect to the ArF exposure light. In addition, the extinction coefficient $k_U$ of the upper layer pattern 32b of the light shielding pattern 3b is greater than the extinction coefficient $k_L$ of the lower layer pattern 31b so that the leaking light from the light shielding zone can sufficiently be suppressed. In this manner, even if the phase shift mask 200 is irradiated with the ArF exposure light with the complicated illumination system, it is possible to sufficiently prevent the CD accuracy of the fine pattern transferred by exposure to the resist film on the semiconductor substrate from being decreased due to the leaking light. Accordingly, when the lower layer film is subjected to dry etching with the pattern of the resist film used as a mask to form a circuit pattern, it is possible to form the high-accuracy circuit pattern without wire shorting or disconnection resulting from insufficient accuracy.

EXAMPLES

Now, the embodiment of this disclosure will be described further in detail by using examples.

Example 1

[Manufacture of Mask Blank]

Referring to FIG. 1, a transparent substrate 1 formed of synthetic quartz glass having main surfaces in a dimension of about 152 mm by about 152 mm and having a thickness of about 6.35 mm was prepared. The transparent substrate 1 has end surfaces and the main surfaces polished to a predetermined surface roughness (0.2 nm or less in root-mean-square roughness Rq), and is thereafter subjected to predetermined cleaning treatment and predetermined drying treatment.

Next, the transparent substrate 1 was placed in a single-wafer DC sputtering apparatus and, by reactive sputtering (DC sputtering) using a mixed sintered target of molybdenum (Mo) and silicon (Si) (Mo:Si=11 atomic %: 89 atomic %) and using, as a sputtering gas, a mixture of argon (Ar), nitrogen ($N_2$), and helium (He), a phase shift film 2 of molybdenum, silicon, and nitrogen was formed on the transparent substrate 1 to a film thickness of 69 nm.

Next, the transparent substrate 1 provided with the phase shift film 2 was subjected to heat treatment in order to reduce film stress of the phase shift film 2 and to form an oxidized layer on a surface layer. Specifically, using a heating furnace (electric furnace), the heat treatment was carried out in air at a heating temperature of 450° C. for a heating time of 1 hour. By using a phase shift amount measuring apparatus (MPM193 manufactured by Lasertec), a transmittance and a phase difference of the phase shift film 2 after the heat treatment with respect to light having a wavelength of 193 nm were measured. As a result, the transmittance was 6.0% and the phase difference was 177.0 degrees (deg).

Next, the transparent substrate 1 provided with the phase shift film 2 was placed in the single-wafer DC sputtering apparatus. By using a chromium (Cr) target, reactive sputtering (DC sputtering) was carried out in a mixture atmosphere of argon (Ar), carbon dioxide ($CO_2$), and helium (He). As a result, a lower layer 31 of a light shielding film (CrOC film) consisting of chromium, oxygen, and carbon was formed in contact with the phase shift film 2 to a film thickness of 43 nm.

Next, the transparent substrate 1 with the phase shift film 2 and the lower layer 31 formed as layers thereon was placed in the single-wafer DC sputtering apparatus. Using a tantalum silicide ($TaSi_2$) target and an argon (Ar) gas as a sputtering gas, an upper layer 32 of the light shielding film 3, which consists of tantalum and silicon, was formed by DC sputtering on the lower layer 31 of the light shielding film 3 to a film thickness of 8 nm.

Next, the transparent substrate 1 provided with the lower layer (CrOC film) 31 and the upper layer (TaSi film) 32 was subjected to heat treatment. Specifically, by using a hot plate, the heat treatment was carried out in air at a heating temperature of 280° C. for a heating time of 5 minutes. After the heat treatment, for the transparent substrate 1 with the phase shift film 2 and the light shielding film 3 formed as layers thereon, an optical density of the layered structure of the phase shift film 2 and the light shielding film 3 at the wavelength (about 193 nm) of the light of the ArF excimer laser was measured using a spectrophotometer (Cary 4000 manufactured by Agilent Technologies). As a result, the optical density was 4.12. Furthermore, surface reflectance of the light shielding film 3 on the opposite side to the phase shift film 2 was measured and was equal to 51%. Finally, predetermined cleaning treatment was carried out to manufacture the mask blank 100 in Example 1.

The mask blank in which the phase shift film 2 and the light shielding film 3 are formed as layers on a main surface of another transparent substrate 1 was manufactured under the same conditions. The phase shift film 2 and the light shielding film 3 of the mask blank were analyzed by X-ray photoelectron spectroscopy (XPS) (with RBS correction). As a result, an internal region of the phase shift film 2, except a surface layer (a region to a depth of 3 nm from a surface on the opposite side to the transparent substrate 1) in which oxidization progresses, had a composition of Mo: 6 atomic %, Si: 45 atomic %, and N: 49 atomic %. The lower layer 31 of the light shielding film 3 had a composition of Cr: 71 atomic %, 0:15 atomic %, and C: 14 atomic %. An internal region of the upper layer 32, except a surface layer (a region to a depth of 3 nm from a surface on the opposite side to the transparent substrate 1) in which oxidization progresses, had a composition of Ta: 32 atomic % and Si: 68 atomic %. In the lower layer 31, a difference in content of each constituent element in a thickness direction is 3 atomic % or less. Thus, it was confirmed that no substantial composition gradient existed in the thickness direction. In the internal region of the upper layer 32, a difference in content of each constituent element in the thickness direction is 3 atomic % or less. Thus, it was confirmed that, in the internal region, no substantial composition gradient existed in the thickness direction. Furthermore, it was confirmed that the total content of tantalum (Ta) and silicon (Si) in a whole of the upper layer 32 was 80 atomic % or more.

The refractive index n and the extinction coefficient k in the lower layer 31 and the upper layer 32 of the light shielding film 3 with respect to the light having the wavelength of 193 nm were measured by using a spectroscopic ellipsometer (M-2000D manufactured by J. A. Woollam Co., Inc.). As a result, the refractive index $n_L$ and the extinction coefficient $k_L$ of the lower layer 31 at the wavelength of 193 nm were 1.82 and 1.83, respectively. The refractive index $n_U$ and the extinction coefficient $k_U$ of the upper layer 32 at the wavelength of 193 nm were 1.78 and 2.84, respectively. The ratio $n_U/n_L$ obtained by dividing the refractive index $n_U$ of the upper layer 32 at the wavelength of 193 nm by the refractive index $n_L$ of the lower layer 31 at the wavelength of 193 nm was 0.978.

[Manufacture of Phase Shift Mask]

Next, using the mask blank 100 in Example 1, the halftone phase shift mask 200 in Example 1 was manufactured in the following steps. At first, the surface of the upper layer 32 of the light shielding film 3 was subjected to HMDS treatment. Subsequently, the resist film of a chemically-amplified type resist for electron beam writing was formed by spin coating in contact with the surface of the upper layer 32 to a film thickness of 100 nm. Next, to the resist film, the first pattern as the phase shift pattern to be formed on the phase shift film 2 was written by electron beam. Then, predetermined developing treatment and predetermined cleaning treatment were carried out to form the resist pattern 4a having the first pattern (see FIG. 2A). The first pattern written by exposure was a pattern optimized by applying SMO. The first pattern has fine patterns in the vicinity of the light shielding zone, as shown by $p_{1a}$ to $p_{1d}$ in FIG. 3.

Next, the upper layer 32 was subjected to dry etching using a fluorine-based gas ($SF_6$+He) with the resist pattern 4a as a mask to form the first pattern (upper layer pattern 32a) on the upper layer 32 (see FIG. 2B). Next, the resist pattern 4a was removed (see FIG. 2C). Subsequently, the lower layer 31 was subjected to dry etching (high-bias etching with electric power of 50 [W] when the bias voltage is applied) using the mixture of the chlorine-based gas ($Cl_2$) and the oxygen gas (02) (gas flow rate ratio $Cl_2:O_2=13:1$) with the upper layer pattern 32a as a mask to form the first pattern (lower layer pattern 31a) on the lower layer 31 (see FIG. 2D).

Next, the resist film was formed by spin coating on the upper layer pattern 32a and the phase shift film 2. To the resist film, the second pattern (pattern including the light shielding zone pattern) to be formed on the light shielding film 3 was written by exposure with electron beam. Thereafter, predetermined treatments such as developing treatment were carried out to form the resist film (resist pattern 5b) having the second pattern (light shielding pattern) (see FIG. 2E).

Next, dry etching using the fluorine-based gas ($SF_6$+He) was carried out to form the first pattern (phase shift pattern 2a) on the phase shift film 2 with the lower layer pattern 31a used as a mask and to form the second pattern (upper layer pattern 32b) on the upper layer pattern 32a with the resist pattern 5b used as a mask (see FIG. 2F). Thereafter, the resist pattern 5b was removed (see FIG. 2G). Next, dry etching using the mixture of the chlorine gas ($Cl_2$) and the oxygen gas ($O_2$) (gas flow rate ratio $Cl_2:O_2=4:1$) with the upper layer pattern 32b as a mask was carried out to form the second pattern (lower layer pattern 31b) on the lower layer pattern 31a (see FIG. 2G, 2H). Finally, through predetermined treatments such as cleaning, the phase shift mask 200 in Example 1 was obtained (see FIG. 2H).

The phase shift mask 200 in Example 1 was subjected to mask inspection by using a mask inspection apparatus (Teron 600 Series manufactured by KLA-Tencor). As a result, no defect was found in the phase shift pattern 2a. From the above, it was confirmed that, even the light shielding film 3 higher in light shielding performance than before can fully function as a hard mask in forming the fine pattern of the resist pattern 4a on the phase shift film 2. It was also confirmed that, even if the total content of metal and silicon in the upper layer 32 is increased, the upper layer has high resistance against dry etching with the mixture of the chlorine-based gas and the oxygen gas, which is performed when the fine pattern is formed on the lower layer 31, and functions as a hard mask. Furthermore, although the light shielding film 3 having higher light shielding performance than before caused a concern about a problem of decrease in CD accuracy of the fine pattern formed on the light shielding film 3 and resultant decrease in CD accuracy of the fine pattern formed on the phase shift film 2 and a problem of occurrence of pattern collapse of the light shielding film 3, those problems are no longer problematic at all. It was confirmed that those fine patterns had high CD accuracy and occurrence of pattern collapse of the light shielding film 3 can be suppressed.

[Evaluation of Pattern Transfer Performance]

On a mask stage of the exposure apparatus capable of emitting the ArF exposure light to the phase shift mask 200 with the illumination system optimized by SMO, the phase shift mask 200 in Example 1 was placed. On the resist film on the semiconductor substrate, transfer by exposure was repeatedly carried out in an arrangement as illustrated in FIG. 3. The resist film on the semiconductor substrate after transfer by exposure was subjected to developing treatment and so on to form the resist pattern. The resist pattern was observed by SEM. As a result, it was confirmed that the resist pattern was formed with high CD accuracy. It was also confirmed that the fine patterns $P_{1d}$, $P_{2c}$, $P_{3b}$, and $P_{4a}$, for which a decrease in CD accuracy was concerned, in the vicinity of the image $S_{1234}$ in the region where the light shielding zone was transferred by exposure four times as illustrated in FIG. 3 were formed with high CD accuracy. From the above-mentioned results, a circuit pattern can be formed with high accuracy by dry etching with the resist pattern used as a mask.

Example 2

[Manufacture of Mask Blank]

A mask blank 100 in Example 2 was manufactured in the steps similar to those in Example 1 except that the lower layer 31 of the light shielding film 3 was formed to a thickness of 18 nm and the upper layer 32 was formed to a thickness of 24 nm. For the mask blank 100 in Example 2, an optical density of the layered structure of the phase shift film 2 and the light shielding film 3 at the wavelength (about 193 nm) of the light of the ArF excimer laser was measured by using the spectrophotometer (Cary4000 manufactured by Agilent Technologies). As a result, the optical density was 4.12. Furthermore, a surface reflectance of the light shielding film 3 on the opposite side to the phase shift film 2 was measured and was 55%.

[Manufacture of Phase Shift Mask]

Next, using the mask blank 100 in Example 2, a phase shift mask 200 in Example 2 was manufactured in the steps similar to those in Example 1. Like in Example 1, the phase shift mask 200 in Example 2 was subjected to mask inspection using the mask inspection apparatus (Teron 600 Series manufactured by KLA-Tencor). As a result, no defect was found in the phase shift pattern 2a. From this, the matter similar to that in Example 1 could be confirmed.

[Evaluation of Pattern Transfer Performance]

Like in case of Example 1, on the mask stage of the exposure apparatus capable of emitting the ArF exposure light to the phase shift mask 200 with the illumination system optimized by SMO, the phase shift mask 200 in Example 2 was placed. On the resist film on the semiconductor substrate, transfer by exposure was repeatedly carried out in the arrangement as illustrated in FIG. 3. The resist film on the semiconductor substrate after transfer by exposure was subjected to developing treatment and so on to form the resist pattern. The resist pattern was observed by SEM. As a result, it was confirmed that the resist pattern was formed with high CD accuracy. It was confirmed that the fine patterns $P_{1d}$, $P_{2c}$, $P_{3b}$, and $P_{4a}$, for which a decrease in CD accuracy was concerned, in the vicinity of the image $S_{1234}$ in the region where the light shielding zone was transferred by exposure four times as illustrated in FIG. 3 were formed with high CD accuracy. From the above-mentioned results, a circuit pattern can be formed with high accuracy by dry etching with the resist pattern used as a mask.

Example 3

[Manufacture of Mask Blank]

The mask blank 100 in Example 3 was manufactured in the steps similar to those in Example 1 except the light shielding film 3. In the light shielding film 3 in Example 3, the lower layer 32 is formed of a CrOCN film and the upper layer 31 has a composition same as that in Example 1 but is changed in film thickness. Specifically, the transparent substrate 1 provided with the phase shift film 2 was placed in the single-wafer DC sputtering apparatus and, using a chromium (Cr) target, reactive sputtering (DC sputtering) was carried out in a mixture atmosphere of argon (Ar), carbon dioxide ($CO_2$), nitrogen ($N_2$), and helium (He). Thus, the lower layer 31 of the light shielding film (CrOCN film) 3 consisting of chromium, oxygen, carbon, and nitrogen was formed in contact with the phase shift film 2 to a film thickness of 43 nm. Next, the transparent substrate 1 with the phase shift film 2 and the lower layer 31 formed as layers thereon was placed in the single-wafer DC sputtering apparatus and, using a tantalum silicide ($TaSi_2$) target and an argon (Ar) gas as a sputtering gas, DC sputtering was carried out to form the upper layer 32, consisting of tantalum and silicon, of the light shielding film 3 was formed on the lower layer 31 of the light shielding film 3 to a thickness of 12 nm.

Like in Example 1, the mask blank in which the phase shift film 2 and the light shielding film 3 are formed as layers on a main surface of another transparent substrate 1 was manufactured under the same conditions. The lower layer 31 and the upper layer 32 of the mask blank in Example 3 were analyzed by X-ray photoelectron spectroscopy (XPS, with RBS correction). As a result, the lower layer 31 had a composition of Cr: 55 atomic %, 0:22 atomic %, C: 12 atomic %, and N: 11 atomic %. In an internal region of the lower layer 31, a difference in content of each constituent element in a thickness direction is 3 atomic % or less. Thus, it was confirmed that no substantial composition gradient existed in the film thickness direction. For the upper layer 32, the result was substantially similar to that of the upper layer 32 in Example 1.

The refractive index n and the extinction coefficient k in the lower layer 31 of the mask blank in Example 3 with respect to the light having the wavelength of 193 nm were measured by using a spectroscopic ellipsometer (M-2000D manufactured by J. A. Woollam Co., Inc.). As a result, the refractive index $n_L$ and the extinction coefficient $k_L$ of the lower layer 31 at the wavelength of 193 nm were 1.93 and 1.50, respectively. For the upper layer 32, the result was substantially same as that of the upper layer in Example 1. The ratio $n_U/n_L$ obtained by dividing the refractive index $n_U$ of the upper layer 32 at the wavelength of 193 nm by the refractive index $n_L$ of the lower layer 31 at the wavelength of 193 nm was 0.922. For the mask blank in Example 3, an optical density of the layered structure of the phase shift film 2 and the light shielding film 3 at the wavelength (about 193 nm) of the light of the ArF excimer laser was measured by using the spectrophotometer (Cary4000 manufactured by Agilent Technologies). As a result, the optical density was 4.06. Furthermore, a surface reflectance of the light shielding film 3 on the opposite side to the phase shift film 2 was measured and was 52%.

[Manufacture of Phase Shift Mask]

Next, using the mask blank 100 in Example 3, the phase shift mask 200 in Example 3 was manufactured in the steps similar to those in Example 1. Like in Example 1, the phase shift mask 200 in Example 3 was subjected to mask inspection using the mask inspection apparatus (Teron 600 Series manufactured by KLA-Tencor). As a result, no defect was found in the phase shift pattern 2a. From this, the matter similar to that in Example 1 could be confirmed.

[Evaluation of Pattern Transfer Performance]

Like in case of Example 1, on the mask stage of the exposure apparatus capable of emitting the ArF exposure light to the phase shift mask 200 with the illumination system optimized by SMO, the phase shift mask 200 in Example 3 was placed. On the resist film on the semiconductor substrate, transfer by exposure was repeatedly carried out in the arrangement as illustrated in FIG. 3. The resist film on the semiconductor substrate after transfer by exposure was subjected to developing treatment and so on to form the resist pattern. The resist pattern was observed by SEM. As a result, it was confirmed that the resist pattern is formed with high CD accuracy. It was also confirmed that the fine patterns $P_{1d}$, $P_{2c}$, $P_{3b}$, and $P_{4a}$, for which a decrease in CD accuracy was concerned, in the vicinity of the image $S_{1234}$ in the region where the light shielding zone was transferred by exposure four times as illustrated in FIG. 3 were formed with high CD accuracy. From the above-mentioned results, a circuit pattern can be formed with high accuracy by dry etching with the resist pattern used as a mask.

Comparative Example 1

[Manufacture of Mask Blank]

A mask blank in Comparative Example 1 was manufactured in the steps similar to those in Example 1 except the light shielding film 3. In the light shielding film in Comparative Example 1, the lower layer is formed of a CrOCN film while the upper layer is formed of an $SiO_2$ film. Specifically, the transparent substrate provided with the phase shift film was placed in the single-wafer DC sputtering apparatus and, using a chromium (Cr) target, reactive sputtering (DC sputtering) was carried out in a mixture atmosphere of argon (Ar), carbon dioxide ($CO_2$), nitrogen ($N_2$), and helium (He). Thus, the lower layer of the light shielding film (CrOCN film) consisting of chromium, oxygen, carbon, and nitrogen was formed in contact with the phase shift film to a film thickness of 43 nm. Next, the transparent substrate with the phase shift film and the lower layer of the light shielding film formed as layers thereon was placed in a single-wafer RF sputtering apparatus and, using a silicon dioxide ($SiO_2$) target and an argon (Ar) gas as a sputtering gas, RF sputtering was carried out to form the upper layer, consisting of silicon and oxygen, of the light shielding film was formed on the lower layer of the light shielding film to a thickness of 12 nm.

Like in Example 1, the mask blank in which the phase shift film and the light shielding film are formed as layers on a main surface of another transparent substrate was manufactured under the same conditions. The lower layer and the upper layer of the mask blank in Comparative Example 1 were analyzed by X-ray photoelectron spectroscopy (XPS, with RBS correction). As a result, the lower layer had a composition of Cr: 55 atomic %, 0:22 atomic %, C: 12 atomic %, and N: 11 atomic %. The upper layer had a composition of Si: 35 atomic % and O: 65 atomic %. In an internal region of each of the lower layer and the upper layer, a difference in content of each constituent element in a thickness direction is 3 atomic % or less. Thus, it was confirmed that, in the internal region, no substantial composition gradient existed in the thickness direction.

Like in Example 1, the refractive index n and the extinction coefficient k in the lower layer of the mask blank in Comparative Example 1 with respect to the light having the wavelength of 193 nm were measured by using the spectroscopic ellipsometer (M-2000D manufactured by J. A. Woollam Co., Inc.). As a result, the refractive index $n_L$ and the extinction coefficient $k_L$ of the lower layer at the wavelength of 193 nm were 1.93 and 1.50, respectively. The refractive index $n_U$ and the extinction coefficient $k_U$ of the upper layer at the wavelength of 193 nm were 1.59 and 0.00, respectively. The ratio $n_U/n_L$ obtained by dividing the refractive index $n_U$ of the upper layer 32 at the wavelength of 193 nm by the refractive index $n_L$ of the lower layer 31 at the wavelength of 193 nm was 0.824. For the mask blank in Comparative Example 1, an optical density of the layered structure of the phase shift film and the light shielding film at the wavelength (about 193 nm) of the light of the ArF excimer laser was measured by using the spectrophotometer (Cary4000 manufactured by Agilent Technologies). As a result, the optical density was 3.01. Furthermore, a surface reflectance of the light shielding film on the opposite side to the phase shift film was measured and was 11%.

Next, using the mask blank in Comparative Example 1, a phase shift mask 200 in Comparative Example 1 was manufactured in the steps similar to those in Example 1. Like in Example 1, the phase shift mask in Comparative Example 1 was subjected to mask inspection using the mask inspection apparatus (Teron 600 Series manufactured by KLA-Tencor). As a result, no defect was found in the phase shift pattern 2a. From the above, it has been confirmed that the light shielding film 3 (without improving light shielding performance by the composition and without assuring the optical density by increasing the thickness) having the light shielding performance equivalent to that in the past fully functions as a hard mask in forming the fine pattern of the resist pattern 4a on the phase shift film.

[Evaluation of Pattern Transfer Performance]

Like in Example 1, on the mask stage of the exposure apparatus capable of emitting the ArF exposure light to the phase shift mask 200 with the illumination system optimized by SMO, the phase shift mask in Comparative Example 1 was placed. On the resist film on the semiconductor substrate, transfer by exposure was repeatedly carried out in the arrangement as illustrated in FIG. 3. The resist film on the semiconductor substrate after transfer by exposure was subjected to developing treatment and so on to form the resist pattern. The resist pattern was observed by SEM. As a result, it was confirmed that the CD accuracy was particularly low in the fine patterns $P_{1d}$, $P_{2c}$, $P_{3b}$, and $P_{4a}$, for which a decrease in CD accuracy was concerned, in the vicinity of the image $S_{1234}$ in the region where the light shielding zone was transferred by exposure four times as illustrated in FIG. 3. From the above-mentioned results, when a circuit pattern is formed by dry etching with the resist pattern used as a mask, circuit failure or the like may possible occur.

EXPLANATION OF REFERENCE SYMBOLS 1 transparent substrate
2 phase shift film
2a phase shift pattern
3 light shielding film
31 lower layer
32 upper layer
3b light shielding pattern
31a, 31b lower layer pattern
32a, 32b upper layer pattern
4a, 5b resist pattern
100 mask blank
200 phase shift mask

The invention claimed is:

1. A mask blank comprising:
a transparent substrate;
a phase shift film on the transparent substrate; and
a light shielding film on the phase shift film,
wherein an optical density of a portion of the mask blank that includes the phase shift film and the light shielding film is at least 3.5 with respect to exposure light of an ArF excimer laser, and
wherein the light shielding film has a lower layer and an upper layer, the lower layer being closer to the transparent substrate than the upper layer is, and
wherein the lower layer contains chromium, and a total content of chromium, oxygen, nitrogen, and carbon in the lower layer is at least 90 atomic %, and
wherein the upper layer contains metal and silicon, and a total content of metal and silicon in the upper layer is at least 80 atomic %, and
wherein an extinction coefficient $k_U$ of the upper layer with respect to the exposure light is greater than an extinction coefficient $k_L$ of the lower layer with respect to the exposure light.

2. The mask blank according to claim 1, wherein the phase shift film has a transmittance of at least 1% with respect to the exposure light.

3. The mask blank according to claim 1, wherein the extinction coefficient $k_L$ of the lower layer is at most 2.0.

4. The mask blank according to claim 1, wherein a refractive index $n_U$ of the upper layer with respect to the exposure light is smaller than a refractive index $n_L$ of the lower layer with respect to the exposure light, and
wherein a ratio $n_U/n_L$ of the refractive index $n_U$ of the upper layer with respect to the exposure light to the refractive index $n_L$ of the lower layer with respect to the exposure light is at least 0.8.

5. The mask blank according to claim 4, wherein the refractive index $n_L$ of the lower layer is at most 2.0.

6. The mask blank according to claim 1, wherein a total content of chromium, oxygen, and carbon in the lower layer is at least 90 atomic %.

7. The mask blank according to claim 1, wherein a total content of tantalum and silicon in the upper layer is at least 80 atomic %.

8. The mask blank according to claim 1, wherein the phase shift film contains silicon.

9. A phase shift mask comprising:
a transparent substrate;
a phase shift film having a transfer pattern on the transparent substrate; and
a light shielding film having a light shielding zone pattern on the phase shift film,
wherein an optical density of a portion of the phase shift mask that includes the phase shift film and the light shielding film is at least 3.5 with respect to exposure light of an ArF excimer laser, and
wherein the light shielding film has a lower layer and an upper layer, the lower layer being closer to the transparent substrate than the upper layer is, and
wherein the lower layer contains chromium, and a total content of chromium, oxygen, nitrogen, and carbon in the lower layer is at least 90 atomic %, and
wherein the upper layer contains metal and silicon, and a total content of metal and silicon in the upper layer is at least 80 atomic %, and
wherein an extinction coefficient $k_U$ of the upper layer with respect to the exposure light is greater than an extinction coefficient $k_L$ of the lower layer with respect to the exposure light.

10. The phase shift mask according to claim 9, wherein the phase shift film has a transmittance of at least 1% with respect to the exposure light.

11. The phase shift mask according to claim 9, wherein the extinction coefficient $k_L$ of the lower layer is at most 2.0.

12. The phase shift mask according to claim 9, wherein a refractive index $n_U$ of the upper layer with respect to the exposure light is smaller than a refractive index $n_L$ of the lower layer with respect to the exposure light, and
wherein a ratio $n_U/n_L$ of the refractive index $n_U$ of the upper layer with respect to the exposure light to the refractive index $n_L$ of the lower layer with respect to the exposure light is at least 0.8.

13. The phase shift mask according to claim 12, wherein the refractive index $n_L$ of the lower layer is at most 2.0.

14. The phase shift mask according to claim 9, wherein a total content of chromium, oxygen, and carbon in the lower layer is at least 90 atomic %.

15. The phase shift mask according to claim 9, wherein a total content of tantalum and silicon in the upper layer is being at least 80 atomic %.

16. The phase shift mask according to claim 9, wherein the phase shift film contains silicon.

17. A method for manufacturing a semiconductor device, comprising transferring a transfer pattern by exposure to a resist film on a semiconductor substrate using a phase shift mask comprising:
 a transparent substrate;
 a phase shift film having a transfer pattern on the transparent substrate; and
 a light shielding film having a light shielding zone pattern on the phase shift film,
 wherein an optical density of a portion of the phase shift mask that includes the phase shift film and the light shielding film is at least 3.5 with respect to exposure light of an ArF excimer laser, and
 wherein the light shielding film has a lower layer and an upper layer, the lower layer being closer to the transparent substrate than the upper layer is, and
 wherein the lower layer contains chromium, and a total content of chromium, oxygen, nitrogen, and carbon in the lower layer is at least 90 atomic %, and
 wherein the upper layer contains metal and silicon, and a total content of metal and silicon in the upper layer is at least 80 atomic %, and
 wherein an extinction coefficient $k_U$ of the upper layer with respect to the exposure light is greater than an extinction coefficient $k_L$ of the lower layer with respect to the exposure light.

\* \* \* \* \*